US011538773B2

(12) United States Patent
Hong et al.

(10) Patent No.: US 11,538,773 B2
(45) Date of Patent: Dec. 27, 2022

(54) ELECTRONIC DEVICE PACKAGE AND METHOD OF MANUFACTURING ELECTRONIC DEVICE PACKAGE

(71) Applicant: Samsung Electro-Mechanics Co., Ltd., Suwon-si (KR)

(72) Inventors: Seok Yoon Hong, Suwon-si (KR); Seohyun Park, Suwon-si (KR); Hyukki Kwon, Suwon-si (KR); Hansu Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 198 days.

(21) Appl. No.: 17/076,106

(22) Filed: Oct. 21, 2020

(65) Prior Publication Data

US 2022/0037271 A1 Feb. 3, 2022

(30) Foreign Application Priority Data

Jul. 29, 2020 (KR) .................. 10-2020-0094608

(51) Int. Cl.
*H01Q 1/22* (2006.01)
*H01L 23/552* (2006.01)
(Continued)

(52) U.S. Cl.
CPC ............ *H01L 23/66* (2013.01); *H01L 23/552* (2013.01); *H01Q 1/2283* (2013.01); *H01Q 1/526* (2013.01); *H01L 2223/6677* (2013.01)

(58) Field of Classification Search
CPC .................. H01L 23/66; H01L 23/552; H01L 2223/6677; H01Q 1/2283; H01Q 1/526
(Continued)

(56) References Cited

U.S. PATENT DOCUMENTS

2006/0151203 A1* 7/2006 Krueger ............... H03H 9/1071
29/841
2008/0074334 A1* 3/2008 Kang ..................... H01Q 1/243
343/702
(Continued)

FOREIGN PATENT DOCUMENTS

JP 2011-187779 A 9/2011
JP 2018-93015 A 6/2018
(Continued)

OTHER PUBLICATIONS

Korean Office Action dated Feb. 18, 2022 in corresponding Korean Patent Application No. 10-2020-0094608 (8 pages in English and 7 pages in Korean).

*Primary Examiner* — Didarul A Mazumder
(74) *Attorney, Agent, or Firm* — NSIP Law

(57) ABSTRACT

An electronic device package includes: a board including first surface and a second surface facing away from each other, and including a first layer adjacent to the first surface and a second layer adjacent to the second surface, wherein a step portion is formed on a side surface between the first layer and the second layer; an electronic device mounted on the first surface; an antenna layer formed in the second layer or on the second surface; a molded portion formed to cover the electronic device on the first surface; and a conductive film formed to cover a surface of the molded portion and a side surface of the first layer, and including an end portion positioned at the step portion.

19 Claims, 11 Drawing Sheets

(51) Int. Cl.
*H01L 23/66* (2006.01)
*H01Q 1/52* (2006.01)

(58) Field of Classification Search
USPC .......................... 257/678, 659; 438/106, 121
See application file for complete search history.

(56) References Cited

U.S. PATENT DOCUMENTS

| | | | |
|---|---|---|---|
| 2013/0234337 A1* | 9/2013 | Hsu ....................... | H01L 23/556 |
| | | | 257/774 |
| 2018/0159217 A1 | 6/2018 | Mikata et al. | |
| 2019/0103653 A1* | 4/2019 | Jeong ................... | H01Q 1/2283 |
| 2019/0109094 A1 | 4/2019 | Jang et al. | |
| 2019/0198450 A1* | 6/2019 | Lee ....................... | H01L 21/561 |
| 2019/0310687 A1 | 10/2019 | Hong et al. | |
| 2019/0319347 A1* | 10/2019 | Fang ................... | H01L 23/3128 |
| 2020/0075502 A1 | 3/2020 | Kim et al. | |
| 2020/0260572 A1* | 8/2020 | Okunaga .............. | H05K 1/0243 |
| 2021/0204395 A1 | 7/2021 | Yamamoto et al. | |

FOREIGN PATENT DOCUMENTS

| | | | |
|---|---|---|---|
| JP | 2019-68013 A | 4/2019 | |
| JP | WO2020/067468 A1 | 4/2020 | |
| KR | 10-2019-0116887 A | 10/2019 | |

\* cited by examiner

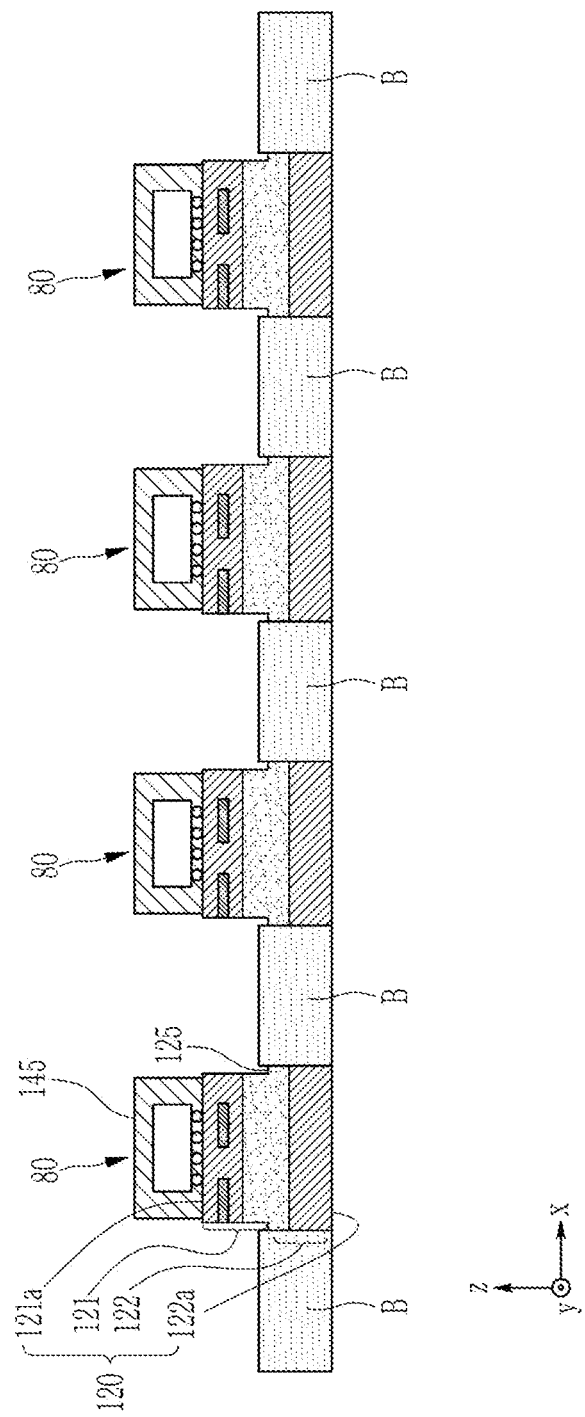

ELECTRONIC DEVICE PACKAGE AND METHOD OF MANUFACTURING ELECTRONIC DEVICE PACKAGE

CROSS-REFERENCE TO RELATED APPLICATIONS

This application claims the benefit under 35 U.S.C. § 119(a) of Korean Patent Application No. 10-2020-0094608 filed on Jul. 29, 2020 in the Korean Intellectual Property Office, the entire disclosure of which is incorporated herein by reference for all purposes.

BACKGROUND

1. Field of the Invention

The following description relates to a package in which an electronic device is mounted on a board, and a manufacturing method of such a package.

2. Description of the Related Art

With development of smart devices, a demand for personal and portable products is rapidly increasing in the electronic product market. In order to enhance portability of a smart device while improving a function and performance of the smart device, it is continuously required to reduce a size and weight of an electronic device embedded in a system of the smart device.

In order to implement the down-sizing and weight reduction of an electronic device, along with the technological development of reducing an individual size of components mounted in the electronic device, a technology of integrating a plurality of individual components into a single electronic device has been developed. For example, a system-on-chip (SoC) is a computer or battery system component integrated in one integrated circuit, and a system-in-package (SIP) is a technology capable of implementing light weight and small size by implementing multiple circuits formed of separate chips into a single package.

In addition to the issue of down-sizing, a high-frequency electronic device package that processes a high-frequency signal, such as a communication module or a network module, may cause an electromagnetic problem such as electromagnetic interference (EMI) or poor electromagnetic compatibility (EMC) between respective components in the high-frequency electronic device package or between respective high-frequency electronic device packages. Therefore, it is required to provide various electromagnetic shielding structures in order to realize excellent shielding characteristics against the electromagnetic problem (EMI and EMC).

However, in a package provided with an antenna, performance of the package may deteriorate even when an antenna layer is covered with an electromagnetic shielding film.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an electronic device package includes: a board including first surface and a second surface facing away from each other, and including a first layer adjacent to the first surface and a second layer adjacent to the second surface, wherein a step portion is formed on a side surface between the first layer and the second layer; an electronic device mounted on the first surface; an antenna layer formed in the second layer or on the second surface; a molded portion formed to cover the electronic device on the first surface; and a conductive film formed to cover a surface of the molded portion and a side surface of the first layer, and including an end portion positioned at the step portion.

The step portion may be formed by a side surface of the second layer protruding farther than the side surface of the first layer in a direction parallel to the first surface.

The step portion may include a curved surface connecting the side surface of the first layer to the side surface of the second layer.

The step portion may extend along a circumference on a side surface of the board on which the conductive film is formed.

The step portion may be formed on at least three side surfaces of the board disposed adjacent to each other along a circumference of the board, and on which the conductive film is formed.

The board may further include a core insulation layer as an intermediate layer. The step portion may be disposed on a side surface of the core insulation layer.

The core insulation layer may be positioned over the first layer and the second layer.

An end portion of the conductive film may be disposed on a portion of the step portion formed on the side surface of the core insulation layer.

The conductive film may not be formed on a side surface of the second layer.

The antenna layer may be disposed on the second surface of the board.

The electronic device may include a first component covered by the molded portion and a second component disposed outside the molded portion. A conductive shielding wall may be disposed between the first component and the second component. The conductive film may be formed on a portion of the surface of the molded portion covering the first component. The shielding wall may form a boundary of the conductive film.

In another general aspect, a method of manufacturing an electronic device package includes: preparing a strip board including a first surface and a second surface facing away from each other, wherein the strip board includes a first layer adjacent to the first surface and a second layer adjacent to the second surface, and wherein an antenna layer is formed on or in the second layer; forming a plurality of package units by mounting an electronic device on the first surface of the strip board and forming a molded portion covering the electronic device; forming a first cutting groove having a first width by partially sawing the strip board through the first layer for each package unit among the plurality of package units; forming a second cutting groove having a second width narrower than the first width by partially sawing the strip board through the second layer for each package unit; separating the strip board into a board for each package unit to form a step portion on a side surface between the first layer and the second layer; and forming a conductive film on the board for each package unit such that the conductive film extends from the molded portion to the step portion on the side surface between the first layer and the second layer.

The forming of the conductive film may include: forming the conductive film to cover a surface of the molded portion and a side surface of the board for each package unit; and removing a portion of the conductive film formed below the step portion on a side surface of the second layer of the board for each package unit.

The forming of the conductive film may include: interposing a masking block between adjacent package units among the plurality of package units to expose a side surface of the first layer of the board for each package unit and to cover a side surface of the second layer of the board for each package unit; and forming the conductive film to cover a surface of the molded portion and the side surface of the first layer of the board for each package unit.

In another general aspect, an electronic device package includes: a board including a first layer and a second layer disposed below the first layer; an electronic device mounted on an upper surface of the first layer; an antenna layer formed in or on the second layer; a molded portion formed to cover the electronic device on the upper surface of the first layer; and a conductive film formed to cover a surface of the molded portion and a side surface of the first layer. The side surface of the second layer extends farther than a corresponding side surface of the first layer, in a direction parallel to the upper surface of the first layer. The conductive film is not disposed on the corresponding side surface of the second layer.

An end portion of the conductive film may be disposed on a step portion connecting the side surface of the first layer to the corresponding side surface of the second layer.

The step portion may have a curved surface.

The board may further include a core insulation layer disposed between the first layer and the second layer, and forming a step portion connecting the side surface of the first layer to the corresponding side surface of the second layer.

The conductive film may be disposed on the step portion.

Other features and aspects will be apparent from the following detailed description, the drawings, and the claims.

BRIEF DESCRIPTION OF THE DRAWINGS

FIG. 6A to FIG. 6D illustrate process diagrams of a method of manufacturing the electronic device package of FIG. 1, according to an embodiment, wherein FIG. 6C illustrates a cross-sectional view taken along line VI-VI of FIG. 6B.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
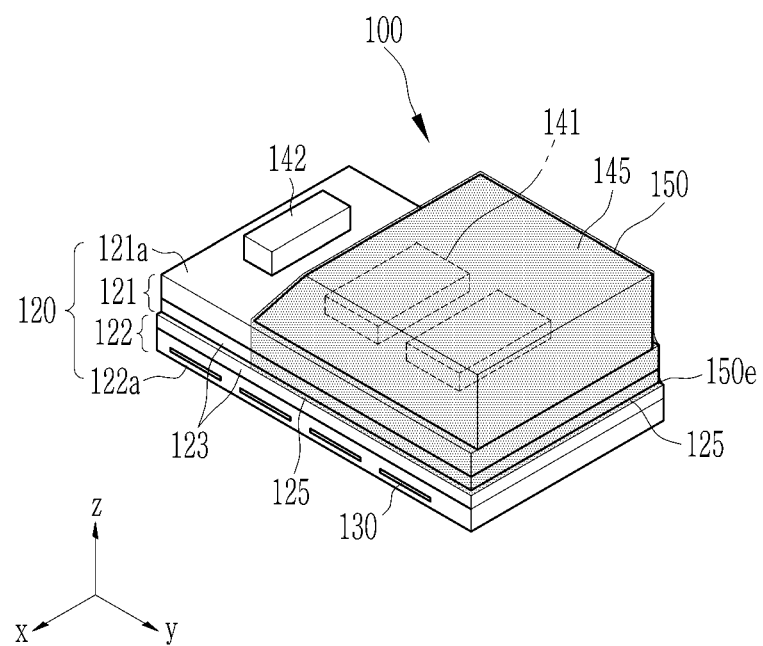
FIG. 1 illustrates a perspective view of an electronic device package, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

FIG. 1 illustrates a perspective view of an electronic device package 100, according to an embodiment.

Referring to FIG. 1, the electronic device package 100 may include, for example, a board 120, electronic devices 141 and 142 mounted on the board, and an antenna layer 130 formed on a layer of the board 120. In addition, a molded portion 145 is formed on the board 120 to cover a portion of the electronic device 141, and a conductive film 150 is formed to cover the molded portion 145.

The board 120 includes a first surface (e.g., an upper surface) 121a and a second surface (e.g., a lower surface) 122a facing opposite directions, and, for example, the board 120 may be a multi-layered circuit board in which a plurality of insulating layers and a plurality of wire layers are repeatedly stacked. Accordingly, the board 120 may include a first layer 121 close (e.g., adjacent) to the first surface 121a and a second layer 122 close (e.g., adjacent) to the second surface 122a.

In addition, the board 120 may include a core insulation layer 123 as an intermediate layer, and may be formed of a double-sided circuit board having wire layers formed on opposite sides of the core insulation layer 123. For example, the core insulation layer 123 may be positioned over the first layer 121 and the second layer 122 of the board 120. A material of the core insulation layer 123 is not particularly limited as long as the material may ensure insulating performance. For example, a thermosetting resin such as an epoxy resin, a thermoplastic resin such as polyimide, or a resin in which these resins are impregnated in a core material such as a glass fiber (glass fiber, glass cloth, or glass fabric) together with an inorganic filler, for example, an insulating material such as a prepreg, an Ajinomoto build-up film (ABF), FR-4, or bismaleimide triazine (BT), may be used.

The electronic devices 141 and 142 may be mounted on the first surface 121a of the board 120. The electronic devices 141 and 142 may include, for example, active components, such as integrated circuit chips (IC chips), or passive components. That is, the electronic devices 141 and 142 may be devices of various types as long as the electronic devices 141 and 142 are mounted on the board 120 or embedded in the board 120. In addition, the electronic devices 141 and 142 are not limited to main components, and may include various components (elements) mounted on the board 120 like a connector electrically connecting components.

The electronic devices 141 and 142 include at least one first component 141 embedded in the molded portion 145 and at least one second component 142 disposed outside the molded portion 145. For example, the first component 141 may be a passive component or an active component, and the second component 142 may be a connector. However, the disclosure is not limited to the foregoing example.

The molded portion 145 may be formed on the first surface 121a of the board 120 to cover the first component 141. The molded portion 145 is formed to seal the first component 141 in at least a portion of the board 120, thereby safely protecting the first component 141 from external impact. However, as described above, the second component 142 may not be embedded in the molded portion 145, and may be disposed outside the molded portion 145.

The molded portion 145 is formed of an insulating material. For example, the molded portion 145 may be formed of a resin material such as an epoxy mold compound (EMC), but is not limited thereto. In addition, it is possible to form the molded portion 145 with a material having conductivity (for example, conductive resin) as necessary. In this case, a separate insulating sealing member such as an underfill resin may be provided between the second component 142 and the board 120.

The antenna layer 130 may be disposed on the second surface 122a of the board 120, or may be formed on the second layer 122 adjacent to the second surface 122a within the board 120. For example, the antenna layer 130 may be formed by a circuit pattern formed on the board 120. However, the disclosure is not limited to the foregoing example, and various modified embodiments such as an embodiment in which a separately manufactured antenna component is mounted on the second surface 122a of the board 120 are possible.

For example, the board 120 may include a step portion 125 formed on a side surface between the first layer 121 and the second layer 122. That is, in the board 120, a side surface of the second layer 122 may protrude further than a side surface of the first layer 121 in a direction parallel to the first surface 121a to form the step portion 125. When the core insulation layer 123 is formed on the board 120, the step portion 125 may be positioned on a side surface of the core insulation layer 123. In addition, the step portion 125 may extend along a circumference of the side surface of the board 120 on which the conductive film 150 is formed, and may be formed on at least three side surfaces adjacent to each other on which the conductive film 150 is formed.

The conductive film 150 may be formed to cover a surface of the molded portion 145 and a side surface of the first layer 121 of the board 120. The conductive film 150 may be formed by applying a resin material containing a conductive powder along the surface of the molded portion 145 or forming a metal thin film to function as an electromagnetic interference (EMI) shielding film. For example, the conductive film 150 may be deposited by a sputtering process, and may be partially formed by applying a sputtering process while blocking a region in which a conductive film 150 is not to be formed with a masking film. However, the disclosure is not limited to forming the conductive film 150 by a sputtering process, and various techniques such as spray coating, screen printing, vapor deposition, electrolytic plating, and non-electrolytic plating may be used to form the conductive film 150.

In addition, an end portion 150e of the conductive film 150 may be positioned at the step portion 125 on the side surface between the first layer 121 and the second layer 122 of the board 120. Further, when the core insulation layer 123 is formed on the board 120, the step portion 125 may be formed on the side surface of the core insulation layer 123, and the end portion 150e of the conductive film 150 may be positioned at the step portion 125 on the side surface of the core insulation layer 123.

The conductive film 150 is not formed on the side surface of the second layer 122 of the board 120 on which the antenna layer 130 is formed. When the side surface of the antenna layer 130 is covered by the conductive layer 150, a wireless signal transmitted and received through the antenna layer 130 may be blocked by the conductive layer 150. Therefore, the side surface of the antenna layer 130 is formed to be exposed without being covered by the conductive layer 150.

Figure 2:
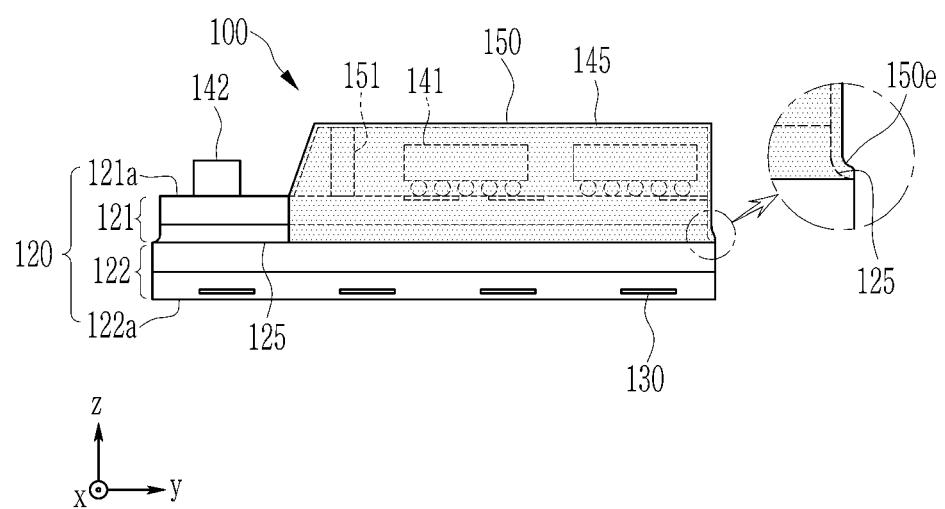
FIG. 2 illustrates a side view of the electronic device package of FIG. 1.

FIG. 2 illustrates a side view of the electronic device package 100.

Referring to FIG. 2, in the electronic device package 100, a shielding wall 151 may be positioned between the first component 141, which is covered by the molded portion 145, and the second component 142, which is positioned outside the molded portion 145. The shielding wall 151 may be formed across the first surface 121a of the board 120 along a width direction (an x-axis direction of the drawing), and may shield electromagnetic interference (EMI) that may occur between the electronic devices 141 and 142 inside and outside the molded portion 145. The molded portion 145 may be formed to cover up to the shielding wall 151.

The shielding wall 151 shields electromagnetic waves input from the second component 142 to the first component 141 or from the first component 141 to the second component 142. The shielding wall 151 may be made of a conductive material capable of shielding flow of electromagnetic waves. A height of the shielding wall 151 may be the same as a height of the molded portion 145. Accordingly, an upper end of the shielding wall 151 may be exposed to the outside of the molded portion 145, and the conductive film 150 may be connected to the upper end of the exposed shielding wall 151.

The conductive film 150 may be formed to cover the entire molded portion 145. That is, the conductive film 150 may be formed to surround four side surfaces of the molded portion 145, which also include a portion covering the shielding wall 151, and to cover the upper surface of the molded portion 145. The conductive film 150 extends to the step portion 125 formed on the side surface of the board 120, and the end portion 150e of the conductive film 150 is positioned on the step portion 125.

The step portion 125 may include a curved surface through which the side surface of the first layer 121 and the side surface of the second layer 122 of the board 120 are connected. Accordingly, when the conductive film 150 is formed, the conductive film 150 may be formed with a uniform thickness even in the step portion 125.

In addition, since the step portion 125 is positioned on the side surface between the first layer 121 and the second layer 122 of the board 120, the side surface of the first layer 121 on which the electronic devices 141 and 142 are mounted is covered by the conductive film 150, and the side surface of the second layer 122 on which the antenna layer 130 is formed is exposed without being covered by the conductive film 150.

Figure 3:
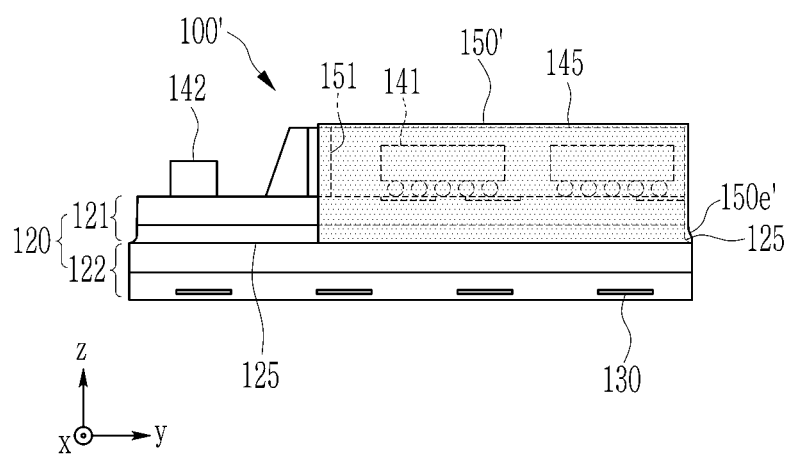
FIG. 3 illustrates a side view of an electronic device package, according to an embodiment.

FIG. 3 illustrates a side view of an electronic device package 100', according to an embodiment.

Referring to FIG. 3, in the electronic device package 100', the shielding wall 151 may be positioned of between the first component 141, which is covered by the molded portion 145, and the second component 142, which is positioned outside the molded portion 145.

A conductive film 150' may be formed on a surface of the molded portion 145 covering the first component 141, with the shielding wall 151 forming a boundary of the conductive film. That is, the conductive film 150' may be formed to cover the upper surface of the molded portion 145 and surround three side surfaces of the molded portion 145, except for a portion of the molded portion 145 formed between the shielding wall 151 and the second component 142, which is a portion formed outside the shielding wall 151. The conductive film 150' extends to the step portion 125 formed on the side surface of the board 120, and an end portion 150e' of the conductive film 150' is positioned on the step portion 125. EMI shielding for a side surface of the molded portion 145 not covered by the conductive film 150' may be provided by the shielding wall 151.

Since the step portion 125 is positioned on the side surface between the first layer 121 and the second layer 122 of the board 120, the side surface of the first layer 121 on which the electronic devices 141 and 142 are mounted is covered by the conductive film 150', and the side surface of the second layer 122 on which the antenna layer 130 is formed is exposed without being covered by the conductive film 150'.

Figure 4:
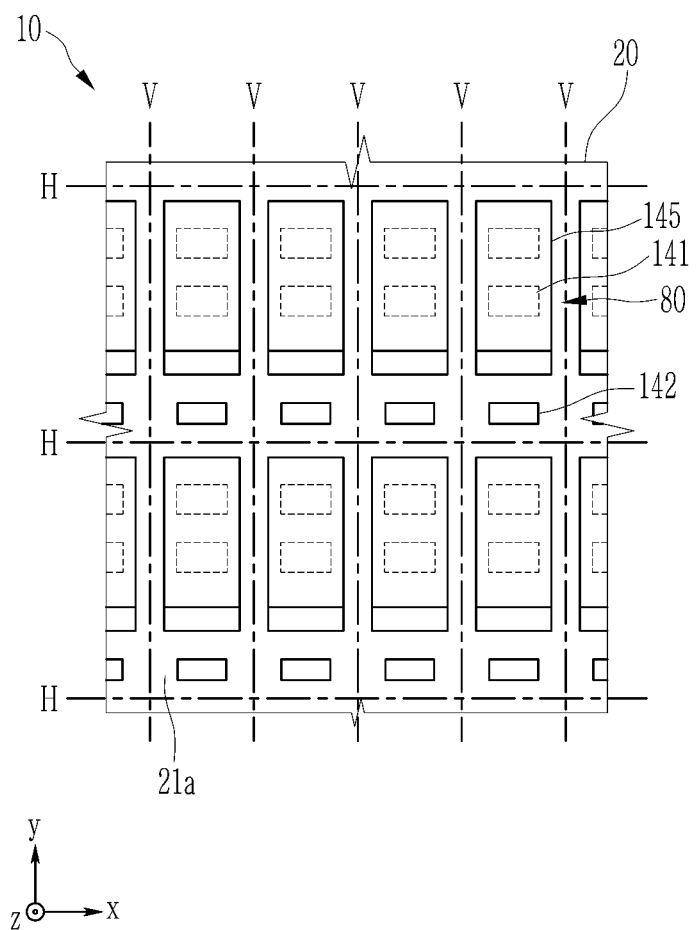
FIG. 4 illustrates a top plan view of a strip board for manufacturing the electronic device package illustrated in FIG. 1, according to an embodiment.

FIG. 4 illustrates a top plan view of a strip board 20 for manufacturing the electronic device package 100, according to an embodiment.

Referring to FIG. 4, a plurality of package units 80 for manufacturing the electronic device package 100 may be arranged in an array form on the strip board 20, which is a board having a panel or strip shape, to form an electronic device package array 10. Accordingly, a plurality of electronic device packages 100 for each of the plurality of package units 80 may be simultaneously manufactured. The strip board 20 may include a first surface 21a and a second surface (a rear surface opposite to the first surface) facing away from each other along a z-axis of the drawing, and may include a first layer close (e.g., adjacent) to the first surface 21a and a second layer close (e.g., adjacent) to the second surface.

The molded portions 145 for mounting the electronic devices 141 and 142 forming each package unit 80 and sealing a portion of the first device 141 may be formed on the first surface 21a of the strip board 20. An antenna layer (not shown) may be formed on the second layer of the strip board 20 to correspond to each package unit 80.

The plurality of package units 80 formed on the strip board 20 of the electronic device package array 10 may be divided into each package unit 80 by cutting the strip board 20 along first cutting lines H extending in a horizontal direction (x-axis direction of the drawing) and along second cutting lines V extending in a vertical direction (y-axis direction of the drawing).

Hereinafter, a method of cutting the strip board 20 and forming the conductive film 150 will be described with reference to FIGS. 5A to 5C and FIGS. 6A 6D.

Figure 5A:
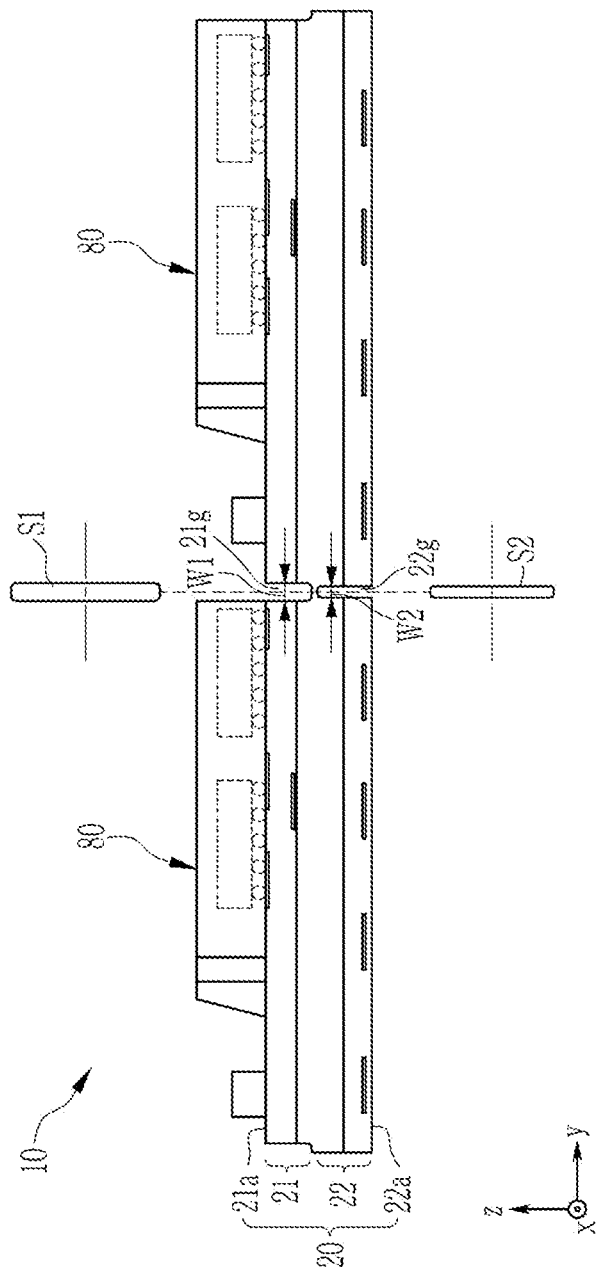
FIG. 5A to FIG. 5C illustrate process diagrams of a method of manufacturing the electronic device package of FIG. 1, according to an embodiment.
Figure 5B:
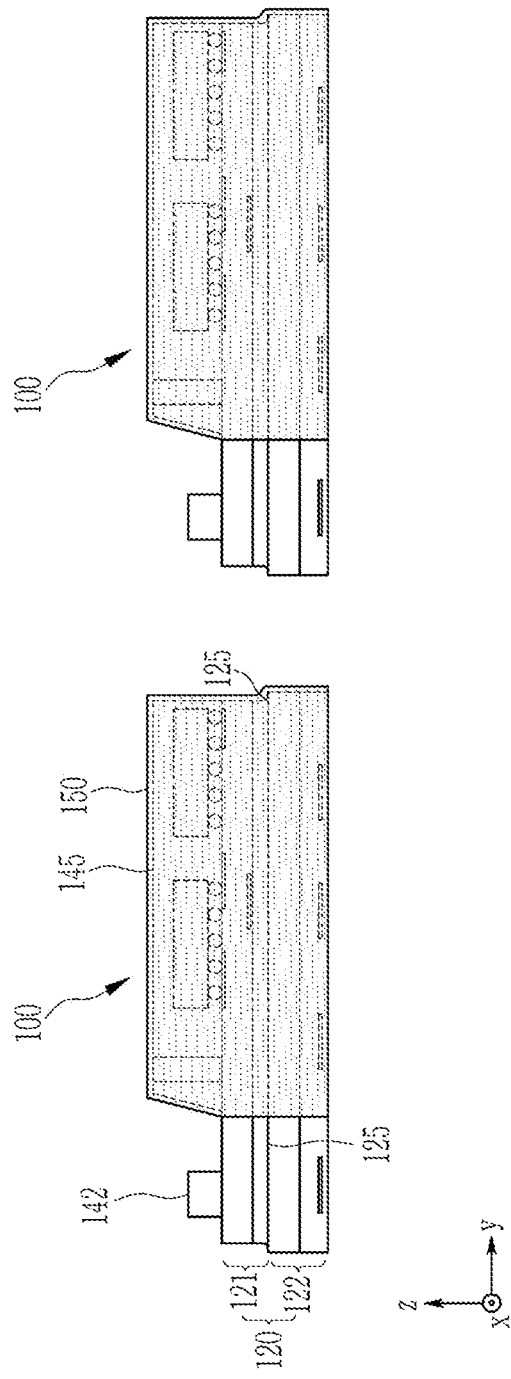
Figure 5C:
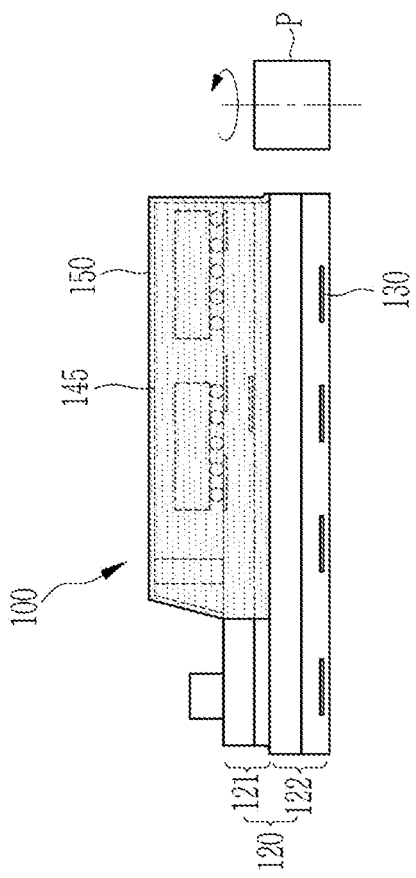

FIGS. 5A to 5C illustrate process diagrams of a method of manufacturing the electronic device package 100, according to an embodiment.

According to the method in FIGS. 5A to 5C, in one operation, the strip board 20 of the electronic device package array 10 may be half-sawed (or partially sawed) through a first layer 21 for each package unit 80, so that a first cutting groove 21g having a first width W1 is formed (see FIG. 5A).

In another operation, the strip board 20 may be half-sawed (or partially sawed) through a second layer 22 for each package unit 80, so that a second cutting groove 22g having a second width W2 is formed. The second width W2 may be formed narrower than the first width W1, and the first width W1 and the second width W2 are widths measured in a direction (y-axis direction in the drawing) parallel to the strip board 20 and perpendicular to an edge of the individual package unit 80.

Half-sawing may be carried out, for example, by using saw blades S1 and S2 having different cutting thicknesses corresponding to the first width W1 and the second width W2, respectively. As another example, half-sawing may be carried out by using a laser. That is, the cutting grooves 21g and 22g may be formed with a depth of approximately half of the first layer 21 and the second layer 22 by allowing the saw blades S1 and S2 or the laser to start from the first surface 21a and a second surface 22a, respectively, of the strip board 20 and then pass through the first layer 21 and the second layer 22, respectively.

In another operation, the step portion 125 is formed between the first layer 121 and the second layer 122 on the side surface of the board 120, and the plurality of package units 80 of the electronic device package array 10 are separated from each other (see FIG. 5B).

By half-sawing starting from the first surface 21a of the strip board 20 and passing through the first layer 21, and by half-sawing starting from the second surface 22a of the strip board 20 and passing through the second layer 22, the first cutting groove 21g and the second cutting groove 22g meet at an intermediate layer of the strip board 20 such that the board 120 may be separated for each of the plurality of package units 80. In this case, since the widths of the first cutting groove 21g and the second cutting groove 22g are different from each other, the step portion 125 may be formed on the side surface of the board 120 separated for each package unit 80 (see FIG. 5B).

In another operation, the conductive film 150 is formed on the package unit 80 so as to cover the surface of the molded portion 145 and the side surface of the board 120 (see FIG. 5B). For example, a conductive material may be deposited along the surface of the molded portion 145 so that the conductive film 150 may function as an electromagnetic interference (EMI) shielding film, and a sputtering process may be performed.

When the sputtering process is performed, ionized gas atoms of a conductive film forming material are ejected and vacuum deposited to form a thin film on the entire surface of the molded portion 145 and the side surface of the board 120. Therefore, the ionized gas atoms ejected in the sputtering process may extend from an upper surface and side surface of the molded portion 145 and may extend to cover the side surface of the board 120.

The method of forming the conductive film 150 is not limited to the above process, and various methods such as a spray coating method, a screen printing method, a vapor deposition method, an electrolytic plating method, and a non-electrolytic plating method may be used to form the conductive film 150.

In another operation, a portion of the conductive film 150 formed on the side surface of the second layer 122 of the board 120 positioned below the step portion 125 is removed (see FIG. 5C).

The removal of the portion of the conductive film 150 formed on the side surface of the second layer 122 may include removing the portion of the applied conductive film 150 using a physical method, for example, polishing. The polishing may be performed by polishing the side surface of the second layer 121 of the board 120 using a polishing apparatus (not shown) including a polishing pad P. In this case, since the side surface of the second layer 122 of the board 120, which is disposed below the step portion 125, protrudes farther than the side surface of the first layer 121, the portion of the conductive film 150 formed on the side surface of the second layer 122 may be easily removed without damaging the portion of the conductive film 150 applied to the side surface of the first layer 121.

Therefore, the electronic device package 100 in which the conductive film 150 is formed on the side surface of the board 120, but is not formed on the antenna layer 130, may be completed. Since the antenna layer 130 is formed on the second layer 122 of the board 120 from which the conductive film 150 is removed and the antenna layer 130 is not shielded by the conductive film 150, deterioration of antenna performance may be prevented.

Figure 6A:
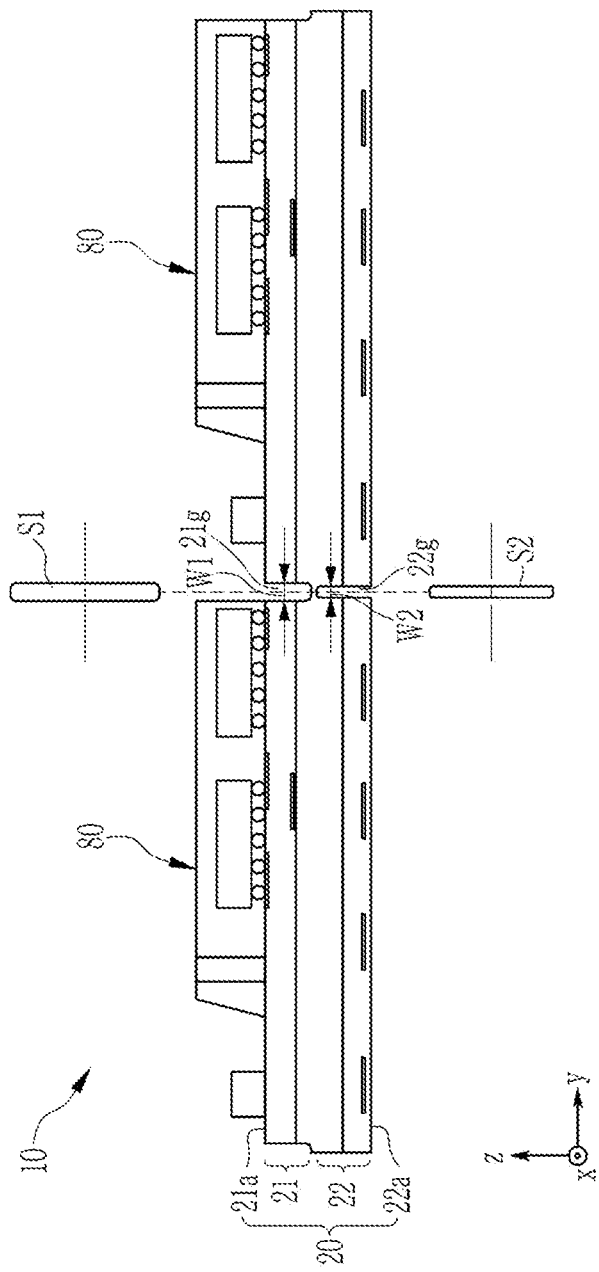
Figure 6B:
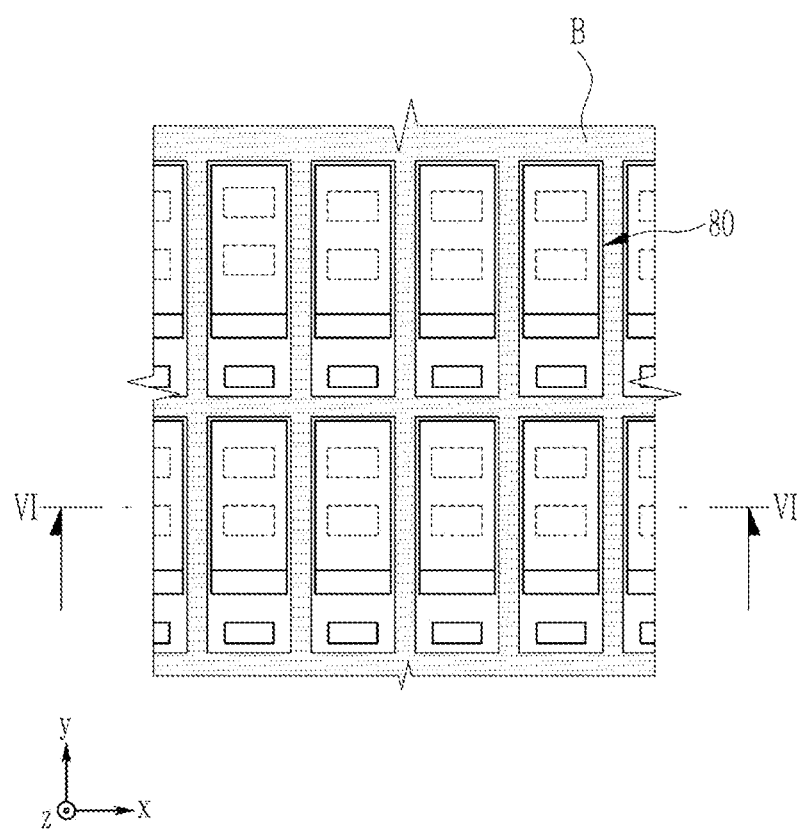

FIG. 6A to FIG. 6D illustrate process diagrams of a method of manufacturing the electronic device package 100, according to an embodiment, wherein FIG. 6C illustrates a cross-sectional view taken along line VI-VI of FIG. 6B.

According to the manufacturing method of FIGS. 6A to 6D, in one operation, the strip board 20 of the electronic device package array 10 is half-sawed through the first layer 21 for each package unit 80, so that the first cutting groove 21g having the first width W1 is formed (see FIG. 6A).

In another operation, the strip board 20 is half-sawed through the second layer 22 for each package unit 80, so that the second cutting groove 22g having the second width W2 is formed. The second width w2 may be formed narrower than the first width W1, and the first width W1 and the second width W2 are widths measured in a direction (y-axis direction in the drawing) parallel to the strip board 20 and perpendicular to an edge of the individual package unit 80.

Half-sawing may be carried out, for example, by using the saw blades S1 and S2 having different cutting thicknesses corresponding to the first width W1 and the second width W2, respectively. As another example, half-sawing may be carried out by using a laser. That is, the cutting grooves 21g and 22g may be formed with a depth of approximately half of the first layer 21 and the second layer 22 by allowing the saw blades S1 and S2 or the laser to start from the first surface 21a and the second surface 22a, respectively, of the strip board 20 and then pass through the first layer 21 and the second layer 22.

In another operation, the step portion 125 is formed between the first layer 121 and the second layer 122 on the side surface of the board 120, and the plurality of package units 80 of the electronic device package array 10 are separated from each other (see FIG. 6B).

By half-sawing starting from the first surface 21a of the strip board 20 and passing through the first layer 21 and by half-sawing starting from the second surface 22a of the strip board 20 and passing through the second layer 22, the first cutting groove 21g and the second cutting groove 22g meet at an intermediate layer of the strip board 20 such that the board 120 may be separated for each of the plurality of package units 80. In this case, since the widths of the first cutting groove 21g and the second cutting groove 22g are different from each other, the step portion 125 may be formed on the side surface of the board 120 separated for each package unit 80 (see FIG. 6C).

In another operation, to prepare for formation of the conductive film 150, a masking block B is interposed between the package units 80 adjacent to each other to cover the side surface of the second layer 122 of the board 120 (see FIGS. 6B and 6C). Referring to FIG. 6C, a height of the masking block B in the z-axis direction may be at least equal to or slightly greater than a height from the second surface 122a to the step portion 125 of the board 120. The masking block B may be formed of single-body masking blocks connected to each other, and a plurality of planar-sized openings corresponding to the individual package units 80 may be formed in the single-body masking block. Therefore, it is possible to prepare for formation of the conductive film 150 by inserting the separated package unit 80 into each opening of the single-body masking block B. As another example, it is also possible to manufacture and utilize the masking block B as an individual masking block B interposed between respective package units 80 without forming the masking block B as a single body.

In another operation, the conductive film 150 is formed to cover the surface of the molded portion 145 and the side surface of the first layer 121 of the board 120. For example, a conductive material may be deposited along the surface of the molded portion 145 so that the conductive film 150 may function as an electromagnetic interference (EMI) shielding film. For example, a sputtering process may be performed to form the conductive film 150.

When the sputtering process is applied, ionized gas atoms of a conductive film forming material are ejected and vacuum deposited to form a thin film on the entire surface of the molded portion 145 and the side surface of the board 120. Therefore, the ionized gas atoms ejected in the sputtering process may extend from an upper surface and side surface of the molded portion 145 and may extend to cover the side surface of the board 120.

The method of forming the conductive film 150 is not limited to the above process, and various methods such as a spray coating method, a screen printing method, a vapor deposition method, an electrolytic plating method, and a non-electrolytic plating method may be used to form the conductive film 150.

Figure 6D:
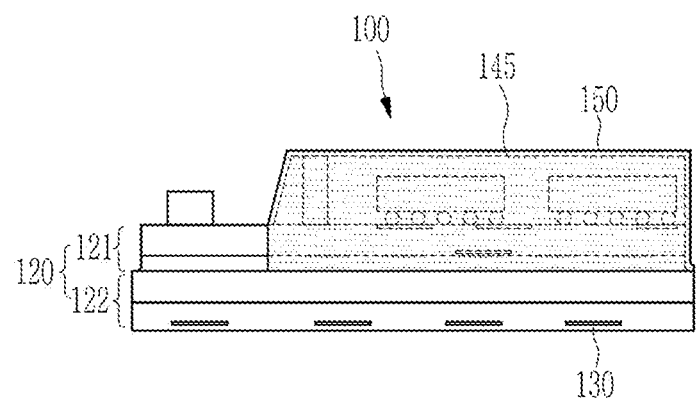

In another operation, the masking block B is removed from the electronic device package 100 to form the conductive film 150 to extend from the molded portion 145 to the step portion 125 of the side surface of the board 120 (see FIG. 6D).

Since the conductive film 150 is formed while the masking block B is interposed between adjacent package units 80, the conductive film 150 is not formed on the side surface of the second layer 122 of the board 120, which is blocked by the masking block B, and the side surface of the second layer 122 is exposed.

Therefore, the electronic device package 100, in which the conductive film 150 is formed on the side surface of the board 120, but is not formed on the antenna layer 130, may be completed. Since the antenna layer 130 is formed on the second layer 122 of the board 120 and it is not shielded by the conductive film 150, deterioration of antenna performance may be prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF SYMBOLS

10: electronic device package array
20: strip board
80: package unit
100, 100': electronic device package
120: board
121: first layer
122: second layer
121a: first surface
122a: second surface
123: core insulation layer
125: step portion
130: antenna layer
141: first component (electronic device)
142: second component (electronic device)
145: molded portion
150: conductive film
151: shielding wall
B: masking block
P: polishing pad
S1, S2: saw blade

What is claimed is:

1. An electronic device package, comprising:
 a board including first surface and a second surface facing away from each other, and including a first layer adjacent to the first surface and a second layer adjacent to the second surface, wherein a step portion is formed on a side surface between the first layer and the second layer;
 an electronic device mounted on the first surface;
 an antenna layer formed in the second layer;
 a molded portion formed to cover the electronic device on the first surface; and
 a conductive film formed to cover a surface of the molded portion and a side surface of the first layer, and including an end portion positioned at the step portion.

2. The electronic device package of claim 1, wherein the step portion is formed by a side surface of the second layer protruding farther than the side surface of the first layer in a direction parallel to the first surface.

3. The electronic device package of claim 2, wherein the step portion includes a curved surface connecting the side surface of the first layer to the side surface of the second layer.

4. The electronic device package of claim 1, wherein the step portion extends along a circumference on a side surface of the board on which the conductive film is formed.

5. The electronic device package of claim 1, wherein the step portion is formed on at least three side surfaces of the board disposed adjacent to each other along a circumference of the board, and on which the conductive film is formed.

6. The electronic device package of claim 1, wherein the board further includes a core insulation layer as an intermediate layer, and
 wherein the step portion is disposed on a side surface of the core insulation layer.

7. The electronic device package of claim 6, wherein the core insulation layer is positioned over the first layer and the second layer.

8. The electronic device package of claim 6, wherein an end portion of the conductive film is disposed on a portion of the step portion formed on the side surface of the core insulation layer.

9. The electronic device package of claim 1, wherein the conductive film is not formed on a side surface of the second layer.

10. The electronic device package of claim 1, wherein the antenna layer is disposed on the second surface.

11. The electronic device package of claim 1, wherein:
the electronic device includes a first component covered by the molded portion and a second component disposed outside the molded portion;
a conductive shielding wall is disposed between the first component and the second component;
the conductive film is formed on a portion of the surface of the molded portion covering the first component; and
the shielding wall forms a boundary of the conductive film.

12. A method of manufacturing an electronic device package, comprising:
preparing a strip board including a first surface and a second surface facing away from each other, wherein the strip board includes a first layer adjacent to the first surface and a second layer adjacent to the second surface, and wherein an antenna layer is formed on or in the second layer;
forming a plurality of package units by mounting an electronic device on the first surface of the strip board and forming a molded portion covering the electronic device;
forming a first cutting groove having a first width by partially sawing the strip board through the first layer for each package unit among the plurality of package units;
forming a second cutting groove having a second width narrower than the first width by partially sawing the strip board through the second layer for each package unit;
separating the strip board into a board for each package unit to form a step portion on a side surface between the first layer and the second layer; and
forming a conductive film on the board for each package unit such that the conductive film extends from the molded portion to the step portion on the side surface between the first layer and the second layer.

13. The method of claim 12, wherein the forming of the conductive film comprises:
forming the conductive film to cover a surface of the molded portion and a side surface of the board for each package unit; and
removing a portion of the conductive film formed below the step portion on a side surface of the second layer of the board for each package unit.

14. The method of claim 12, wherein the forming of the conductive film comprises:
interposing a masking block between adjacent package units among the plurality of package units to expose a side surface of the first layer of the board for each package unit and to cover a side surface of the second layer of the board for each package unit; and
forming the conductive film to cover a surface of the molded portion and the side surface of the first layer of the board for each package unit.

15. An electronic device package, comprising:
a board comprising a first layer and a second layer disposed below the first layer;
an electronic device mounted on an upper surface of the first layer;
an antenna layer formed in or on the second layer;
a molded portion formed to cover the electronic device on the upper surface of the first layer; and
a conductive film formed to cover a surface of the molded portion and a side surface of the first layer,
wherein the side surface of the second layer extends farther than a corresponding side surface of the first layer, in a direction parallel to the upper surface of the first layer, and
wherein the conductive film is not disposed on the corresponding side surface of the second layer.

16. The electronic device package of claim 15, wherein an end portion of the conductive film is disposed on a step portion connecting the side surface of the first layer to the corresponding side surface of the second layer.

17. The electronic device of claim 16, wherein the step portion has a curved surface.

18. The electronic device of claim 15, wherein the board further comprises a core insulation layer disposed between the first layer and the second layer, and forming a step portion connecting the side surface of the first layer to the corresponding side surface of the second layer.

19. The electronic device of claim 18, wherein the conductive film is disposed on the step portion.

* * * * *